United States Patent [19]

Dency et al.

[11] Patent Number: 5,022,556
[45] Date of Patent: Jun. 11, 1991

[54] PROGRAMMABLE VOLUME DISPENSING APPARATUS

[75] Inventors: George G. Dency, Shrewsbury; Marius A. Caramiciu, Dracut, both of Mass.

[73] Assignee: Raytheon Company, Lexington, Mass.

[21] Appl. No.: 427,412

[22] Filed: Oct. 25, 1989

[51] Int. Cl.$^5$ .............................................. B05C 5/00
[52] U.S. Cl. .......................................... 222/1; 222/63; 222/309; 118/410; 118/698
[58] Field of Search .................. 222/1, 52, 63, 639, 222/642, 309, 390, 334; 118/410, 698

[56] References Cited

U.S. PATENT DOCUMENTS

| | | | |
|---|---|---|---|
| 3,666,141 | 5/1972 | Ma et al. | 222/1 |
| 4,298,575 | 11/1981 | Berglund | 73/864.13 |
| 4,572,103 | 2/1986 | Engel | 118/697 |
| 4,622,239 | 11/1986 | Schoenthaler et al. | 427/96 |
| 4,636,406 | 1/1987 | Leicht | 427/96 |
| 4,693,209 | 9/1987 | Leicht | 118/213 |
| 4,702,393 | 10/1987 | Chen | 222/309 X |
| 4,720,402 | 1/1988 | Wojcik | 427/282 |
| 4,869,397 | 9/1989 | Corniea et al. | 222/63 |

Primary Examiner—Kevin P. Shaver
Assistant Examiner—Anthoula Pomrening
Attorney, Agent, or Firm—Walter F. Dawson; Richard M. Sharkansky

[57] ABSTRACT

A programmable volume dispensing apparatus having a positive displacement metering pump for dispensing varying amounts of high viscosity fluids such as soldering paste. The metering pump comprises a positive displacement metering pump and a digitally driven drive motor under programmable control. The drive motor is connected to the volume adjustment of the pump via a chain and sprocket mechanism. The chain and sprocket mechanism adjusts a stop which controls the stroke of the pump and the volume of fluid dispensed. In an alternate embodiment a flexible rotary drive shaft controls the stroke of the pump and the volume of fluid dispensed. Different volumes of solder can be dispensed to different areas and shapes of pads on a circuit board in accordance with preprogrammed dispensing commands.

9 Claims, 4 Drawing Sheets

PROGRAMMABLE VOLUME DISPENSING APPARATUS

The Government has rights in this invention pursuant to Contract No. N00030-84-C-0036 awarded by the Department of the Navy.

BACKGROUND OF THE INVENTION

The invention relates to fluid dispensing apparatus and more particularly to a programmable volume dispensing apparatus.

Piston pumping or positive displacement dispensing provides an ideal method for dispensing certain heavy (high solids, high viscosity) fluids. Precise and repeatable volumes can be dispensed by setting the distance a pump piston travels. A solder paste dispenser for discretely controlled deposition of very small quantities of a viscous fluid at each of a succession of locations on surface mounted device boards is described in U.S. Pat. No. 4,572,103 issued Feb. 25, 1986 to Harold J. Engel. However, if different volumes of dispensing fluids are desired for a series of dispensed fluid shot, the dispensing apparatus must be stopped and manually adjusted to an appropriate setting for the shot volume desired. A trial and error sequence is used to obtain a specific shot volume which involves using precision optical equipment and/or weight measurement of each dispensed shot using specialized instruments. Where many different shot volumes of soldering paste are required for soldering varying sizes of surface mounted devices on a printed wiring board, such a trial and error process must be repeated many times which is not practical for a reliable, cost effective, production line operation.

The manner in which the invention overcomes the disadvantages of the prior art by providing a novel dispensing apparatus for varying the volume of fluid dispensed under programmable control will be understood as this specification proceeds.

SUMMARY OF THE INVENTION

In accordance with the present invention a programmable volume dispensing apparatus is provided comprising means for storing a fluid, means coupled to the storing means for dispensing a specific volume of the fluid from the storing means, means coupled to the dispensing means for selecting the specific volume of the fluid in accordance with a programmed control signal, and programmable control means coupled to the selecting means for generating the control signal, the specific volume of each fluid dispensed being variable in accordance with the programming of the programmable control means. The fluid comprises a solder paste means. The dispensing means comprises a positive displacement metering pump having a programmable adjustable stop for controlling a piston stroke of the pump. The selecting means comprises a drive motor coupled to the programmable control means, and chain and sprocket means having a first sprocket coupled to the drive motor and a second sprocket coupled to the adjustable stop. The programmable control means comprises a plurality of predetermined dispensing commands for adjusting said adjustable stop to provide the specific volume of the fluid to the surface on a circuit board means. In an alternate embodiment of the invention the selecting means comprises a drive motor coupled to the programmable control means, and a rotary drive flexible shaft having a first end coupled to the drive motor and a second end coupled to the adjustable stop.

In accordance with a further feature of the invention, a method for varying the volume of a dispensing apparatus under programmable control is provided comprising the steps of storing a fluid in the dispensing apparatus, selecting a specific volume of the fluid for dispensing in accordance with a preprogrammed control signal, dispensing the specific volume of the fluid from the storing means to a surface, and generating said programmed control signal for each specific volume of fluid to be dispensed in accordance with programmable control means.

BRIEF DESCRIPTION OF THE DRAWINGS

Other and further features of the invention will become apparent in connection with the accompanying drawings wherein.

DESCRIPTION OF THE PREFERRED EMBODIMENT

Figure 1:
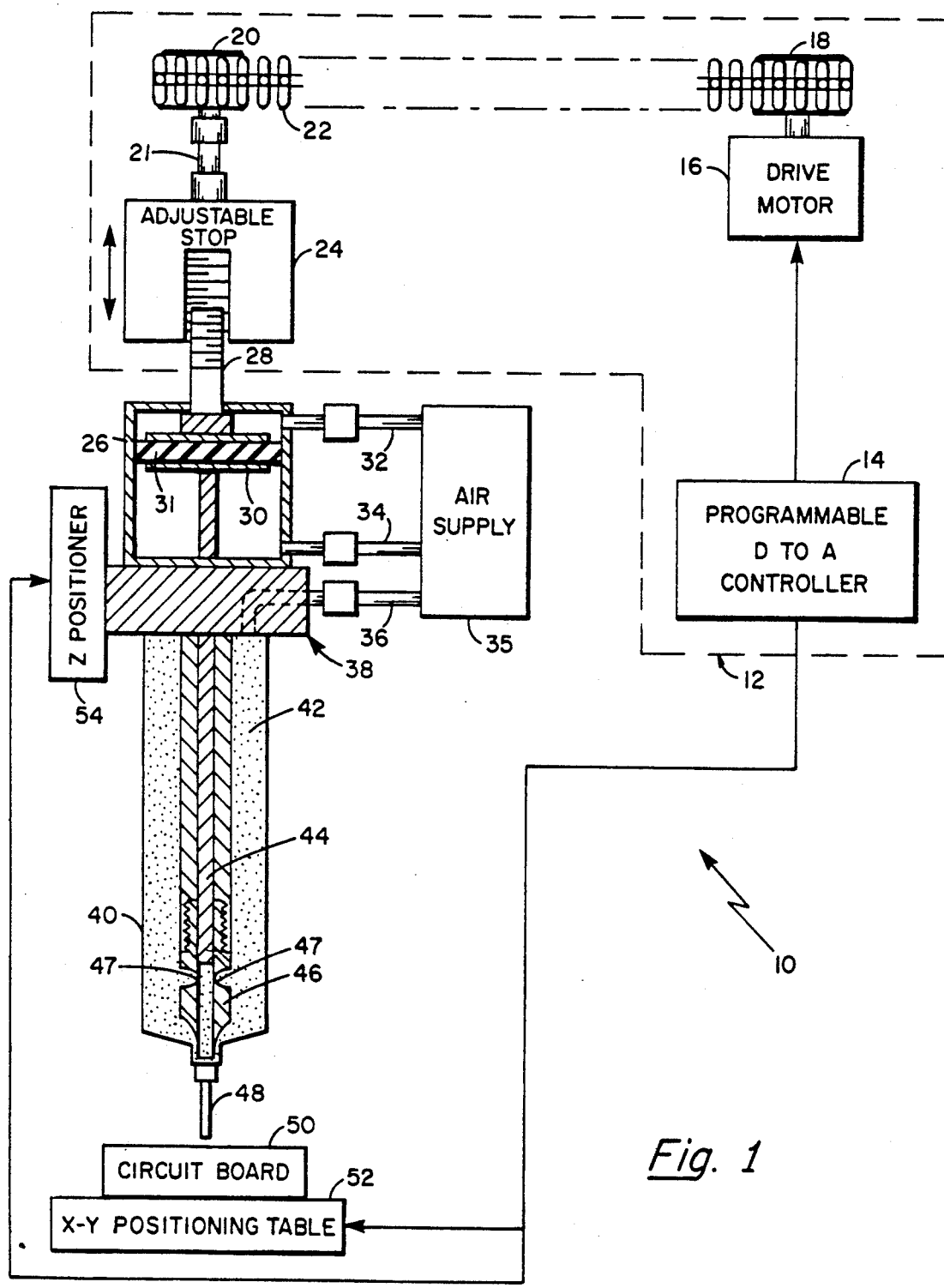
FIG. 1 is a diagram of a programmable volume dispensing apparatus according to the invention.

Referring now to FIG. 1, there is shown a diagram of a programmable volume dispensing apparatus 10 of the present invention. The particular fluid to be dispensed by this embodiment is a solder paste 42 which is stored in a syringe 40. The upper end of the syringe 40 is coupled to a pneumatic air cylinder 26 which has a threaded shaft 28 that screws into an adjustable stop 24. The adjustable stop 24 is under the control of a programmable digital to analog (D to A) controller 14 which determines the volume quantity of solder paste 42 to be deposited at each of a plurality of locations on a circuit board 50 by a dispensing assembly 38. The specific volume of solder paste 42 is variable for each location to be soldered on the circuit board 50 as determined by the programmable D to A controller 14.

The programmable dispensing apparatus 10 has a drive motor 16 which is coupled to the output of the programmable D to A controller 14 for providing programmed control of such drive motor 16, and such drive motor 16 may be an A.C. stepper motor, a D.C. motor or a servo motor. The drive motor 16 drives a first sprocket 18 of a chain and sprocket mechanism comprising sprockets 18,20 and a chain 22. The second sprocket 20 is attached to the adjustable stop 24. The chain and sprocket mechanism (18,20,22) provides the means for precisely adjusting the amount of solder paste 42 to be dispensed via a dispensing head 48 of the dispensing assembly 38. The programmable D/A controller 14 also provides programmable control of an X-Y positioning table 52 and a Z positioner 54. The X-Y positioning table 52 and Z positioner 54 determine under program control the point on the circuit board 50 where the solder paste is dispensed by the dispensing assembly 38.

Still referring to FIG. 1, the ratios of the first sproket 18 and the second sprocket 20 can be varied to increase or decrease the resolution of the adjustable stop 24. The adjustable stop 24 is screwed on the threaded shaft 28

(having #10-32 thread) extending from the air cylinder 26. The adjustable stop 24 can be rotated on the non-rotating threaded shaft 28 in a clockwise or counter-clockwise direction, thereby changing the location of the stop 24 on the non-rotating shaft 28. The programmable D to A controller 18 provides the amount of rotation based on an input via a digital keyboard (not shown) which is coupled to the controller 18. The threaded shaft 28 is attached to a valve assembly 30 which comprises an 0-ring 31 surrounding the valve and a piston 44 extending within the syringe 40 to a dispensing pump 46 which is coupled to the dispensing tip 48. An air supply 35 supplies compressed air to the pneumatic air cylinder 26 and to the syringe 40. The hoses 32 and 34 provide the down and up control respectively for the valve assembly 30 in the air cylinder 26, and hose 36 provides a steady air supply to force the solder 42 into the pump 46 when the piston is retracted (up position). The dispensing assembly 38 may be substantially as disclosed in U.S. Pat. No. 4,572,103, issued Feb. 25, 1986 to Harold J. Engel which describes a device for providing controlled, discrete, small quantity depositions of various material over a succession of locations on surface mounted device boards under computer X-Y-Z control.

Figure 2:
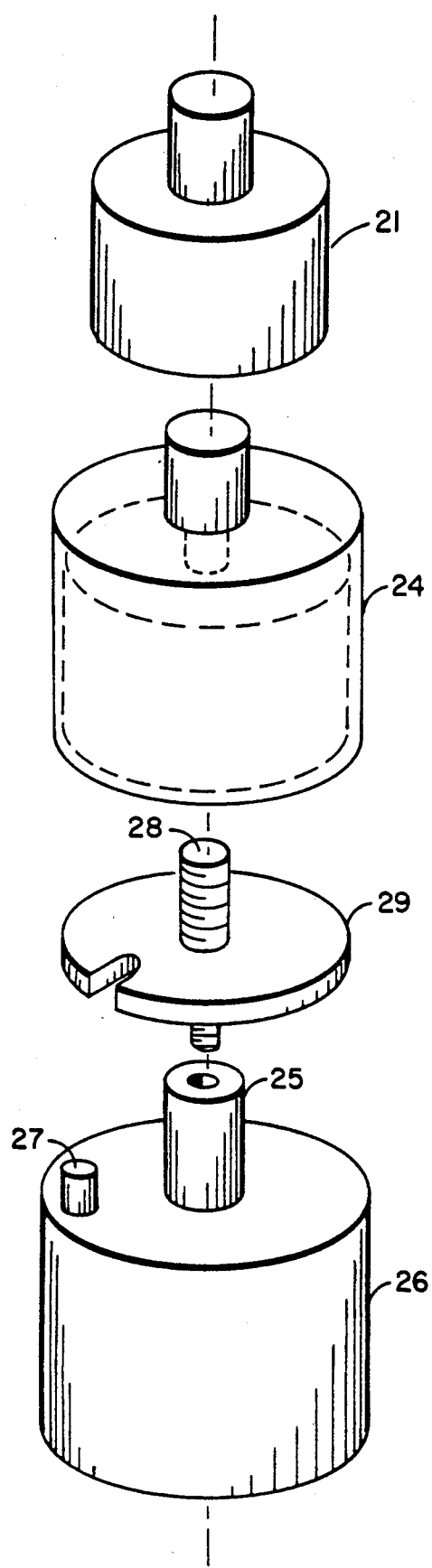
FIG. 2 is an exploded view of an adjustable stop assembly of the present. invention.

Referring now to FIG. 1 and 2, FIG. 2 shows an exploded view of the adjustable stop 24. When the adjustable stop 24 is rotated on the non-rotating threaded shaft 28 in a clockwise or counter-clockwise direction, the location of the stop 24 changes and determines the length that the reciprocating piston 44 travels in the chamber of the pump 46. A keyed non-rotating washer 29 is coupled to the shaft 28 to prevent movement that would affect calibration accuracy. The washer 29 is prevented from moving by an anti-rotating pin 27 attached to the air cylinder; the anti-rotating pin 27 fits into a cutout on the edge of the washer 29. The coupling 21 provides the means for attaching sprocket 20 to the adjustable stop 24.

The accuracy provided by the dispensing apparatus 10 results from the number of degrees of rotation that the drive motor 16 steps in making one complete rotation. This accuracy can be set, based on the accuracy required, e.g., 400 degrees per revolution is twice as accurate as 200 degrees per revolution. A 0.250 inch piston stroke with a 400 degrees per revolutions and five revolutions of adjustment has a total revolution of 400 X 5 or 2,000 points of adjustment. Dividing 0.250 inch piston stroke by 2,000 equals distance per degree rotation. Increasing the sprocket diameter on the adjustable stop will increase the resolution in proportion to the ratio of the increase.

Figure 3:
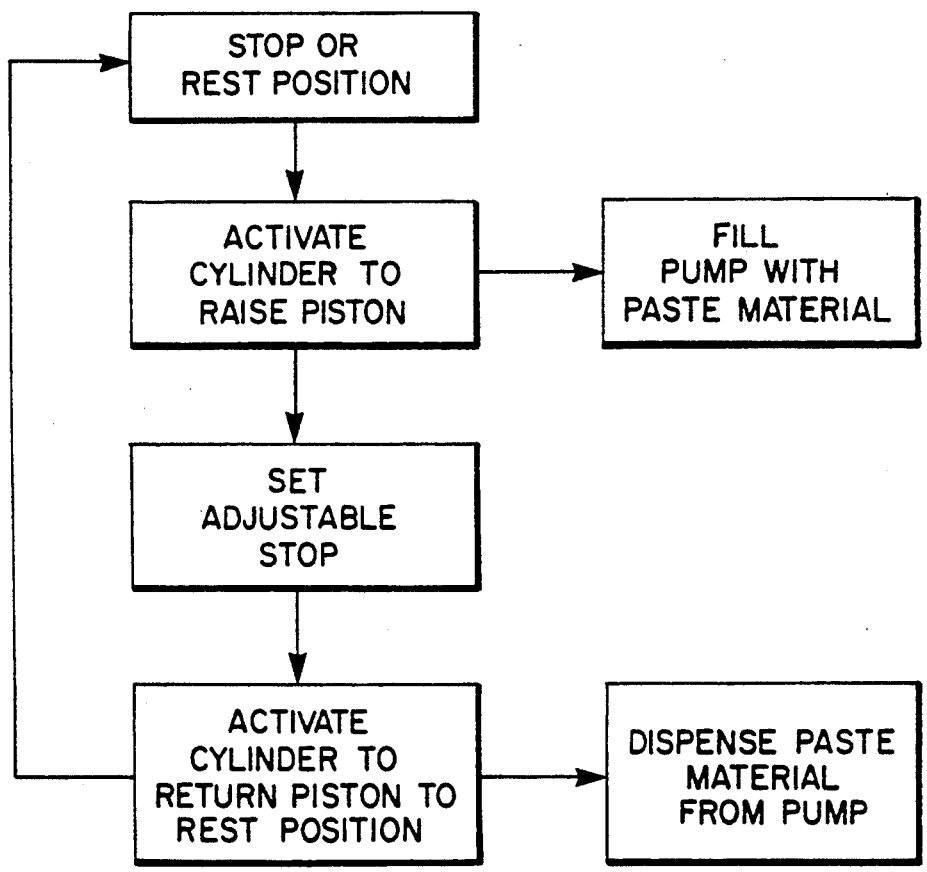
FIG. 3 is a flow chart showing the method of operating the apparatus of the invention.

Referring now to FIG. 3, a flow diagram is shown of the functional steps for providing programmable volume dispensing. Initially, the dispensing apparatus 10 is stopped or at a rest position. The pneumatic air cylinder 26 is activated by air hose 34 moving the piston assembly 30 upward to the opposite end of the air cylinder 26. The raising of the piston 44 causes the pump 46 to be filled with solder paste 42 in the space formerly occupied by the piston 44 via holes 47 in the side walls of the pump 46. Next, the adjustable stop 24 is rotated by the chain and sprocket mechanism to a position that corresponds to a digital value entered into the programmable D/A controller 14, thereby calibrating the volume of the pump's output at the dispensing tip 48. Finally, the air cylinder 26 is activated by air hose 32 moving the valve assembly 30 downward to the next position determined by the adjustable stop 24. When the piston 44 enters the pump 46, the solder paste 42 is pushed out of the pump chamber through the dispensing tip 48. Adjustment of the adjustable stop 24 is made preferentially from shorter to longer strokes. An inverse adjustment results in residual paste material in the pump combining with the output of the new setting; where this cannot be avoided, the first shot is discarded.

The programmable D/A control 14 determines the volume output of the pump 46 of the dispensing assembly 38 by assigning digital values that correspond to the volume range of the pump 46. This volume range is equal to a gravimetric range of values for each material to be dispensed. For each volume value a conversion factor is used to derive the gravimetric measure. The conversion factor for solder paste is a number based on a specific gravity (mass) of the solder alloy metal (such as Sn63Pb37) and the portion of the paste formulation that this metal represents. Multiplying such specific gravity number of the solder alloy by the volume percentage of metal in the paste determines the conversion factor. The solder paste consists of fluids (known to one skilled in the art such as rosin flux and modifiers which give the paste composition its design properties) and fine spherical shaped solder alloy powder. This powder is the volume percentage metal portion of the solder paste formulation. Multiplying the conversion factor by the solid solder volume provides the weight value for the pump calibration.

A table is established which gives the volumetric, gravimetric, and the corresponding piston stroke length values. Such table is used for set-up and programming of the programmable D/A controller 14. The weight (gravimetric) values are used to set up, calibrate, and verify the pump 46 output. Test shots of the solder paste must be heated beyond the reflow temperature of the solder alloy powder to melt it and chemically react the flux and fluid components of the paste to yield semispherical test specimens. These specimens are cleaned to remove residues which can affect weighing accuracies. The specimens are then weighed using a precision scale or balance and compared to the values in the conversion table.

The range of the pump 46 output is linear and corresponds to increased or decreased piston stroke length settings. The weight in milligrams of sample test shots taken at each extreme of the piston 44 stroke can be plotted verses the total length in inches of the piston stroke resulting in a linear graph which determines the dynamic range of the pump 46. These tests are performed any time a variable is introduced into formulations already established. Three or more shots should be plotted on such graph to assure data accuracy of the graph. Connecting these points with a line enables the user to read various points along the line to determine the piston stroke settings for programming the D/A controller 14. Relating the stroke setting to X-Y coordinate positions for a substrate (e.g. a printed circuit board with component pads) is performed at this stage by the programmable D/A controller 14.

The programmable D/A controller 14 may be embodied by a precision X-Y-Z computer controlled application system such as the CAM/ALOT 1824 system manufactured by Knight Tool Company, Haverhill, Mass., and a digital positioning system such as the DPS 2000 manufactured by New England Affiliated Technologies, of Haverhill, Mass., for implementing respectively the coordinate locating/dispensing function and the adjustable piston stroke control for the pump 46. The CAM/ALOT 1824 system is programmed to move the dispensing assembly 38 to a position directly above the location on the circuit board 50 that is to receive the solder paste deposit. At each location the dispensing apparatus 10 may pause for the DPS 2000 controller to select the piston stroke length required for the deposit, or it may continue to perform a series of similar deposits until a piston stroke change is necessitated. During pause, cue is made for the DPS 2000 positioner to rotate the adjustable stop 24 atop the dispensing assembly 38 to a value that corresponds to the volume of solder for the next X-Y coordinate position. As noted hereinbefore, the changes in piston stroke length can be accomplished preferably by setting the shortest piston stroke position and moving and dispensing all those coordinate points in sequence, then changing the piston stroke setting to the next longer piston stroke and dispensing the next series of similar deposits until all coordinate points and volumes have been dispensed on a circuit board 50. Alternatively, piston stroke lengths may be changed in a manner that is less circuitous with regard to machine travel over the substrate or circuit board 50, but in a way that places increased cue and communication times on the programmable D/A controller 14. This adds a significant burden to the number of pump adjustments, but in certain cases this alternative may be more desirable.

Figure 4:
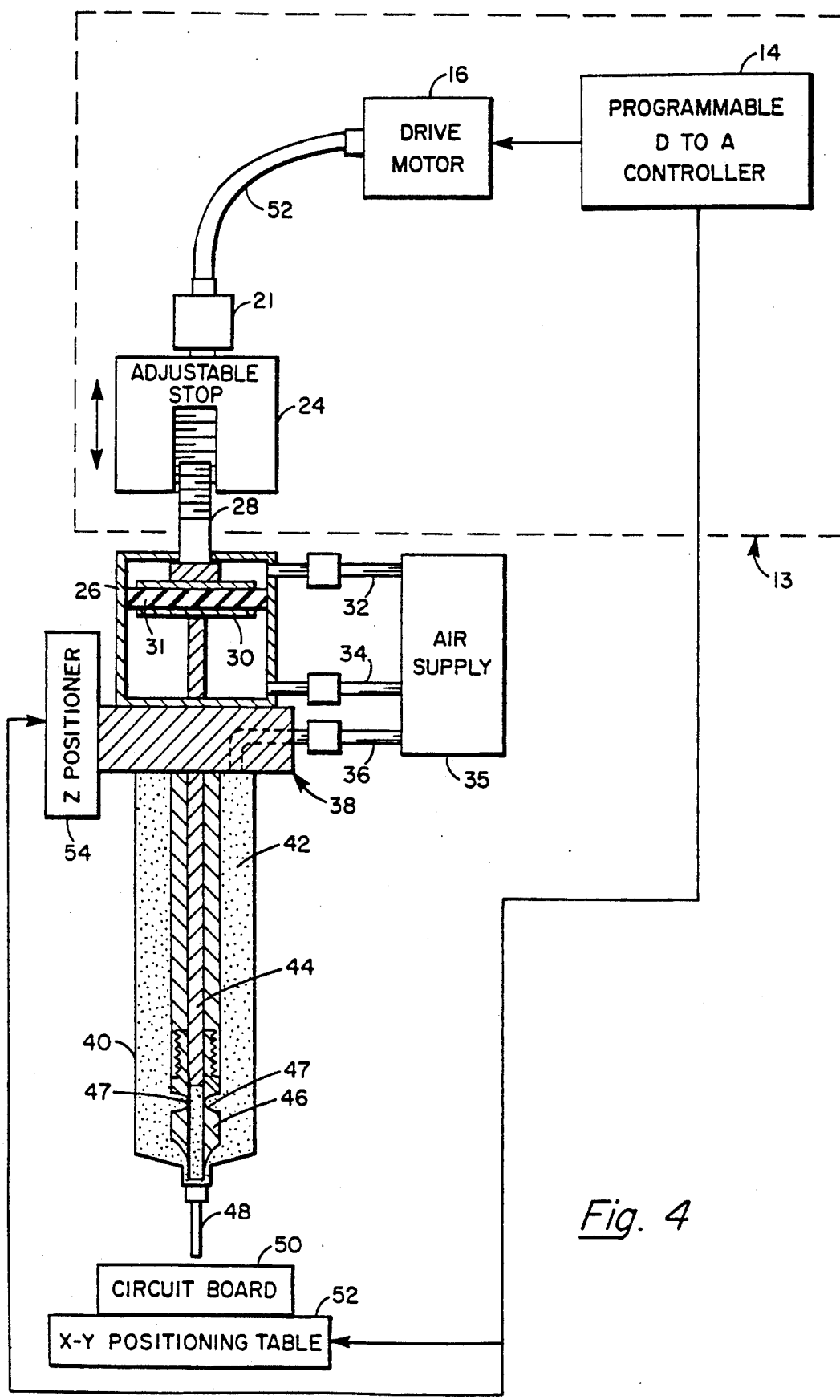
FIG. 4 is a diagram of an alternate embodiment of the invention having a flexible shaft for adjusting the stroke length of a dispensing pump.

Referring now to FIG. 4, an alternate embodiment of the invention is shown comprising a programmable D to A controller 14 which is coupled to a drive motor 16, an X-Y positioning table 52 and a Z positioner 54; in addition there is a dispensing assembly 38. All of these elements are the same as in the preferred embodiment of the programmable volume dispensing apparatus 10. However, in this alternate embodiment a rotary drive flexible shaft 52 provides the coupling between the drive motor 16 and coupling 21 which attaches to the adjustable stop 24 of the dispensing assembly 38. The flexible shaft 52 is placed in approximately a 90° curve to allow limited vertical movement of the entire dispensing assembly 38 up or down. The flexible shaft provides a 1 to 1 ratio correspondence from the shaft of drive motor 16 to the adjustable stop 24 shaft permitting remote location of the motor.

This concludes the description of the preferred and alternate embodiments of the invention. However, many modifications and alterations will be obvious to one of ordinary skill in the art without departing from the spirit and scope of the inventive concept. For example, the programmable D/A controller may be embodied by one integrated computer controlled system instead of the two systems identified herein. Therefore, it is intended that the scope of his invention be limited only by the appended claims.

What is claimed is:

1. A programmable volume dispensing apparatus comprising:
    means for storing a fluid;
    means coupled to said storing means for dispensing a specific volume of said fluid from said storing means;
    means coupled to said dispensing means for selecting said specific volume of said fluid in accordance with a programmed control signal;
    programmable control means coupled to said selecting means for generating said programmed control signal, said specific volume of each fluid dispensed being variable in accordance with the programming of said programmable control means;
    said selecting means comprises a drive motor means coupled to said programmable control means; and
    chain and sprocket means having a first sprocket coupled to said drive motor means and a second sprocket coupled to said dispensing means.

2. The programmable volume dispensing apparatus as recited in claim 1 wherein:
    said dispensing means comprises a positive displacement metering pump having a programmable adjustable stop means for controlling a piston stroke of said pump.

3. The programmable fluid dispensing apparatus as recited in claim 2 wherein:
    said programmable control means comprises a plurality of predetermined dispensing commands for dispensing said specific volume of said fluid to a surface.

4. The programmable volume dispensing apparatus as recited in claim 1 wherein:
    said fluid comprises a solder paste means.

5. A programmable volume dispensing apparatus comprising:
    means for storing a fluid;
    means coupled to said storing means for dispensing a specific volume of said fluid from said storing means;
    said dispensing means comprises a positive displacement metering pump having a programmable adjustable stop means for controlling a piston stroke of said pump;
    means coupled to said dispensing means for selecting said specific volume of said fluid in accordance with a programmed control signal;
    said selecting means comprises a drive motor means coupled to programmable control means;
    flexible shaft means having a first end coupled to said drive motor means and a second end coupled to said adjustable stop means; and
    said programmable control means coupled to said selecting means for generating said control signal, said specific volume of each fluid dispensed being variable in accordance with the programming of said programmable control means.

6. The programmable volume dispensing apparatus as recited in claim 5 wherein:
    said programmable control means comprises a plurality of predetermined dispensing commands for adjusting said adjustable stop means to provide said specific volume of said fluid to a surface.

7. The programmable volume dispensing apparatus as recited in claim 5 wherein:
    said fluid comprises a solder paste means.

8. A method for varying the volume of a dispensing apparatus under programmable control comprising the steps of:
    storing a fluid in said dispensing apparatus;
    selecting a specific volume of said fluid for dispensing in accordance with a programmed control signal by adjusting a stop means for controlling a piston stroke in said dispensing apparatus;
    controlling a chain and sprocket means attached to said stop means in accordance with said programmed control signal;
    dispensing said specific volume of said fluid from said dispensing apparatus; and generating said programmed control signal for each variable specific volume of fluid to be dispensed in accordance with the programming of a programmable control means.

9. A method for varying the volume of a dispensing apparatus under programmable control comprising the steps of:

storing a fluid in said dispensing apparatus;

selecting a specific volume of said fluid for dispensing in accordance with a programmed control signal by adjusting a stop means for controlling a piston stroke in said dispensing apparatus;

controlling a flexible shaft means attached to said stop means in accordance with said programmed control signal;

dispensing said specific volume of said fluid from said dispensing apparatus; and generating said programmed control signal for each variable specific volume of fluid to be dispensed in accordance with the programming of a programmable control means.

* * * * *